US012768048B2

(12) United States Patent
Endo et al.

(10) Patent No.: US 12,768,048 B2
(45) Date of Patent: Oct. 20, 2026

(54) METHOD FOR PRODUCING CORROSION-RESISTANT MEMBER AND LASER CVD DEVICE

(71) Applicant: NIPPON LIGHT METAL COMPANY, LTD., Tokyo (JP)

(72) Inventors: Masanori Endo, Shizuoka (JP); Hiroki Ikeda, Shizuoka (JP); Akihiko Ito, Kanagawa (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 36 days.

(21) Appl. No.: 18/724,884

(22) PCT Filed: Feb. 10, 2023

(86) PCT No.: PCT/JP2023/004651

§ 371 (c)(1),
(2) Date: Jun. 27, 2024

(87) PCT Pub. No.: WO2023/157775

PCT Pub. Date: Aug. 24, 2023

(65) Prior Publication Data

US 2025/0101591 A1 Mar. 27, 2025

(30) Foreign Application Priority Data

Feb. 17, 2022 (JP) ................................ 2022-022675

(51) Int. Cl.
*C23C 16/48* (2006.01)
*C04B 35/505* (2006.01)
(Continued)

(52) U.S. Cl.
CPC .......... *C23C 16/483* (2013.01); *C04B 35/505* (2013.01); *C23C 16/02* (2013.01);
(Continued)

(58) Field of Classification Search
None
See application file for complete search history.

(56) References Cited

U.S. PATENT DOCUMENTS 4,678,536 A * 7/1987 Murayama ................ C23F 1/12 438/758
2023/0386795 A1 * 11/2023 Waldfried ......... H01J 37/32495

FOREIGN PATENT DOCUMENTS

JP H06248455 A * 9/1994
JP H07252662 A * 10/1995
(Continued)

OTHER PUBLICATIONS

International Search Report (ISR) dated Apr. 25, 2023 filed in PCT/JP2023/004651.

(Continued)

*Primary Examiner* — Jose I Hernandez-Kenney
(74) *Attorney, Agent, or Firm* — RANKIN, HILL & CLARK LLP

(57) ABSTRACT

Provided are: a method for producing a corrosion-resistant member, wherein the method enables the formation of an anodized aluminum coating with the occurrence of burning due to irradiation with laser light prevented in spite of the inclusion of aluminum or an aluminum alloy as a substrate; and a laser CVD device to be used for obtaining this. They are: a method for producing a corrosion-resistant member, the method comprising: a coating formation step of forming an yttria coating on a surface of a substrate consisting of aluminum or an aluminum alloy by irradiating the substrate with laser light while the substrate is blown with a raw material gas containing yttrium, wherein the laser light is in the form of a pulse wave, and the substrate is allowed to have a temperature of 300° C. to 600° C. in deposition for forming an yttria coating; and a laser CVD device to be used in this method.

10 Claims, 13 Drawing Sheets

(51) Int. Cl.

| | |
|---|---|
| ***C23C 16/02*** | (2006.01) |
| ***C23C 16/40*** | (2006.01) |
| ***C23C 16/44*** | (2006.01) |
| ***C23C 16/46*** | (2006.01) |
| ***H01J 37/32*** | (2006.01) |

(52) U.S. Cl.
CPC ........ *C23C 16/405* (2013.01); *C23C 16/4404* (2013.01); *C23C 16/463* (2013.01); *H01J 37/32477* (2013.01)

(56) References Cited

FOREIGN PATENT DOCUMENTS

| | | | | |
|---|---|---|---|---|
| JP | 2005243758 | A | | 9/2005 |
| JP | 2010070854 | A | * | 4/2010 |

OTHER PUBLICATIONS

Kimura et al., "Preparation of Structure-Graded Yttria Film by laser CVD", Journal of the Japan Society of Powder and Powder Metallurgy, Japan Society of Powder and Powder Metallurgy, 2005, vol. 52, No. 11, pp. 845-850; English machine translation.

* cited by examiner

METHOD FOR PRODUCING CORROSION-RESISTANT MEMBER AND LASER CVD DEVICE

TECHNICAL FIELD

The present invention relates to a method for producing a corrosion-resistant member comprising a substrate consisting of aluminum or an aluminum alloy and an yttria coating formed on a surface of the substrate, and a laser CVD device, specifically, a method for producing a corrosion-resistant member, wherein an yttria coating is formed by irradiating a substrate with laser light in the form of a pulse wave while the substrate is blown with a raw material gas containing yttrium, and a laser CVD device for obtaining the corrosion-resistant member.

BACKGROUND ART

In etching devices, which are one of semiconductor production devices, plasma etching with highly corrosive halogen gas such as fluorine and chlorine is performed. Accordingly, being exposed to corrosive gas and plasma, parts inside etching devices such as electrostatic chucks to support wafers and deposition shields to prevent the attachment of byproducts of etching (depositions) require highly corrosion-resistant materials.

Ceramic sintered bodies such as aluminum oxide ($Al_2O_3$: alumina) and aluminum nitride are known as plasma-resistant materials for etching devices. However, these sintered bodies may be affected by corrosive gas such as fluorine and chlorine.

On the other hand, yttrium oxide ($Y_2O_3$: yttria), which has superior plasma resistance, is more thermally stable than alumina and also has superior fluorine plasma resistance. However, rare earth elements including yttrium are expensive. Therefore, techniques for obtaining a corrosion-resistant member without the use of a sintered body of yttrium oxide, wherein a surface of a part for which corrosion resistance is required is coated with yttria, have been examined (see Patent Literatures 1 and 2, Non Patent Literature 1).

Among them, Patent Literature 1 discloses a plasma-resistant member including an yttrium oxide coating ($Y_2O_3$ coating) formed on a surface of a substrate by means of chemical vapor deposition (CVD). Examples in Patent Literature 1 show that an yttrium oxide coating of 100 μm in thickness was formed on an alumina substrate by performing CVD treatment while the alumina substrate was heated under a substrate heating temperature of 700° C.

Patent Literature 2 discloses a corrosion-resistant member including an yttrium oxide coating formed on a surface of a substrate by means of a laser CVD method to form a coating by laser irradiation.

Examples 1 to 5 in Patent Literature 2 show that an yttrium oxide coating of 50 μm in thickness was formed on a surface of an alumina substrate by blowing the alumina substrate, which was placed on a sample stage with a heater, with a mixed gas of an organometal complex containing yttrium and oxygen gas and irradiating the alumina substrate with a YAG laser (a semiconductor laser in Example 5) via a window of a chamber while the aluminum substrate was heated to 600 to 800° C.

Non Patent Literature 1 discloses that an yttrium oxide coating is formed on an alumina substrate board at a deposition speed of 270 μm/h through high-speed synthesis of yttrium oxide by means of the same laser CVD method.

Non Patent Literature 1 states that the deposition speed in common CVD is several micrometers per hour (see lines 8 to 9 in the right column on page 845).

Patent Literature 2 presented above discloses Example 6, in which an yttrium oxide coating was formed in the same manner as in Examples 1 to 5 except that an aluminum substrate was used in place of an alumina substrate. According to the examples, for which the laser light used therein is understood to be in the form of a continuous wave, the laser CVD method with the YAG laser as a light source caused the melting of an aluminum substrate and thus had difficulty in forming an yttrium oxide coating, whereas the semiconductor laser was able to form an yttrium oxide coating even on an aluminum substrate, giving a product having strength necessary for structural materials and being preferable as a constituent material of semiconductor production devices.

CITATION LIST

Patent Literature

Patent Literature 1: JP2005-243758 A

Patent Literature 2: JP2010-070854 A

Non Patent Literature

Non Patent Literature 1: Teiichi Kimura, Ryan Banal, Takashi Goto, "Preparation of Structure-Graded Yttria Film by laser CVD", Journal of the Japan Society of Powder and Powder Metallurgy, Japan Society of Powder and Powder Metallurgy, Vol. 52, No. 11 (November 2005), pp. 845-850

SUMMARY OF INVENTION

Technical Problem

The multi-patterning technology in production of semiconductor chips has enabled the formation of finer patterns in recent years. The need for more etching steps because of this has resulted in growing demand for etching devices.

As described above, in such a circumstance that parts to be used inside etching devices require highly corrosion-resistant materials, it is effective to coat surfaces of parts with an yttrium oxide coating (yttria coating), which is superior in both plasma resistance and corrosion resistance. In particular, laser CVD to form a coating by laser irradiation gives much higher deposition speed than CVD with common heating means such as high-frequency induction heating, thus being expected to be promising as a high-speed process for plasma-resistant, corrosion-resistant coatings, which require relatively large thickness such as several tens to several hundreds of micrometers.

While alumina substrate boards are mainly used as a substrate to form an yttria coating thereon by means of conventional laser CVD, using aluminum (or an aluminum alloy), which is superior in mechanical processability, heat dissipation properties, and so on, would be advantageous in constituting the aforementioned parts inside etching devices such as electrostatic chucks and deposition shields. However, the melting point of aluminum is 660° C., which is extremely lower than the melting point of alumina, 2072° C. Hence, aluminum is melted by irradiation with laser light in laser CVD. Patent Literature 2 presented above discloses that an yttria coating was formed without any problem by means of a semiconductor laser, whereas an actual trial conducted by the present inventors has found that burning, a phenomenon in which aluminum as a substrate partially melts, occurred to result in a swollen yttria coating or the formation of vacancies in the substrate, causing a problem in mechanical strength required for corrosion-resistant members.

In view of this, the present inventors have diligently examined on a method for forming a corrosion-resistant member by means of laser CVD, the corrosion-resistant member including a substrate of aluminum or an aluminum alloy and an yttria coating on a surface thereof, and found that deposition with a pulse laser, which produces a pulse wave, while a substrate consisting of aluminum or an aluminum alloy is under temperature control to have a specific temperature prevents the substrate from being overheated to inhibit the burning, enabling the formation of an yttria coating, and thus completed the present invention.

Accordingly, an object of the present invention is to provide a method for producing a corrosion-resistant member, wherein the method enables the formation of an anodized aluminum coating with the occurrence of burning due to irradiation with laser light prevented in spite of the inclusion of aluminum or an aluminum alloy as a substrate, and the corrosion-resistant member is suitable for forming parts to be used under an environment involving exposure to corrosive gas and plasma such as the inside of an etching device.

Another object of the present invention is to provide a laser CVD device to be used for obtaining such a corrosion-resistant member.

Solution to Problem

Specifically, the summary of the present invention is as follows.

(1) A method for producing a corrosion-resistant member comprising a substrate consisting of aluminum or an aluminum alloy and an yttria coating formed on a surface of the substrate, the method comprising:

a coating formation step of forming the yttria coating on the surface of the substrate by irradiating the substrate with laser light while the substrate is blown with a raw material gas containing yttrium, wherein the laser light is in the form of a pulse wave, and the substrate is allowed to have a temperature of 300° C. to 600° C. for forming an yttria coating in the coating formation step.

(2) The method for producing a corrosion-resistant member according to (1), wherein, in the coating formation step, the yttria coating is formed on the substrate placed on a sample stage in a chamber with the sample stage being under temperature control to have a temperature of 0° C. to 200° C.

(3) The method for producing a corrosion-resistant member according to (2), wherein the sample stage is cooled with a liquid refrigerant for the temperature control.

(4) The method for producing a corrosion-resistant member according to any one of (1) to (3), wherein a deposition rate of 10 to 1000 μm/Hr is given for the yttria coating in the coating formation step.

(5) The method for producing a corrosion-resistant member according to any one of (1) to (4), wherein the laser light has an average output of 5 to 2000 W in the coating formation step.

(6) The method for producing a corrosion-resistant member according to any one of (1) to (5), wherein the laser light has a pulse width of 1 to 1000 ns in the coating deposition step.

(7) The method for producing a corrosion-resistant member according to any one of (1) to (6), wherein the laser light has a peak power of 100 W to 30 kW in the coating formation step.

(8) The method for producing a corrosion-resistant member according to any one of (1) to (7), wherein the laser light has a pulse energy of 0.1 to 30 mJ in the coating formation step.

(9) The method for producing a corrosion-resistant member according to any one of (1) to (8), wherein the laser light has an average energy density of 10 to 1000 $W/mm^2$ in laser irradiation in the coating formation step.

(10) The method for producing a corrosion-resistant member according to any one of (1) to (9), the method further including:

a reflectance reduction step of reducing the reflectance of an irradiation target surface of the substrate to be irradiated with the laser light, wherein the reflectance reduction step and the coating formation step are performed in the presented order.

(11) The method for producing a corrosion-resistant member according to any one of (1) to (10), wherein the reflectance at the wavelength of the laser light is set to 50% or less in the reflectance reduction step.

(12) A laser CVD device including: a vacuum chamber; a sample stage on which a substrate is placed in the vacuum chamber; a gas-feeding unit that feeds a raw material gas to the substrate; a laser unit that irradiates the substrate with laser light in the form of a pulse wave via an optical window attached to the vacuum chamber; and a cooling unit that cools the sample stage via a refrigerant.

Advantageous Effects of Invention

The present invention enables the formation of an anodized aluminum coating with the occurrence of burning due to irradiation with laser light prevented in spite of the inclusion of aluminum or an aluminum alloy as a substrate. Accordingly, the present invention can give a corrosion-resistant member that is suitable for forming parts to be used under an environment involving exposure to corrosive gas and plasma such as the inside of an etching device and at the same time superior in mechanical processability.

magnification of 100 times, (b): magnification of 1000 times, (c): magnification of 10000 times].

Figure 8A:
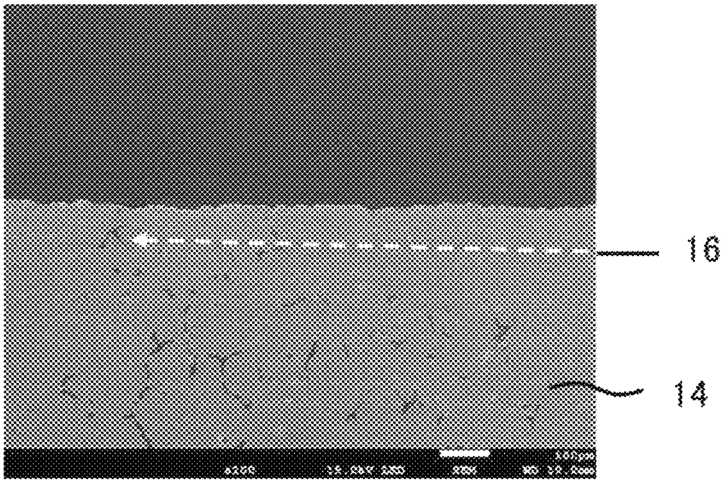
Figure 8B:
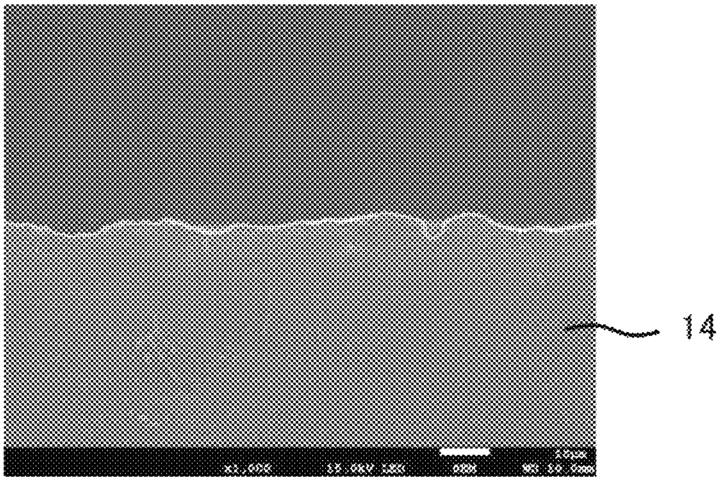
Figure 8C:
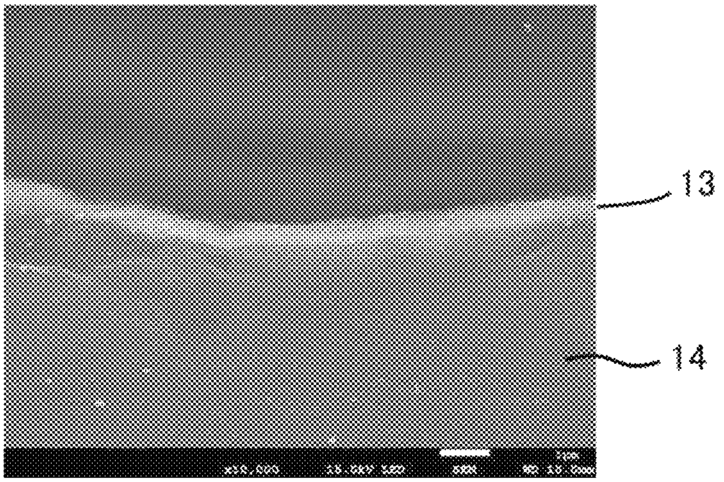

FIG. 8 is a series of cross-sectional SEM images of a test corrosion-resistant member obtained in Comparative Example 1 [(a): magnification of 100 times, (b): magnification of 1000 times, (c): magnification of 10000 times].

Figure 9A:
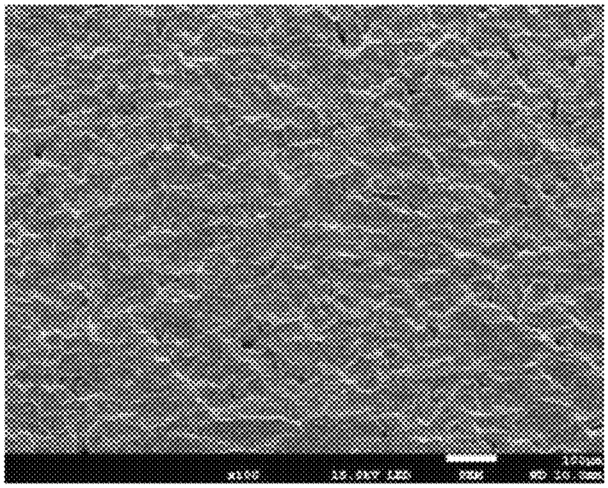
Figure 9B:
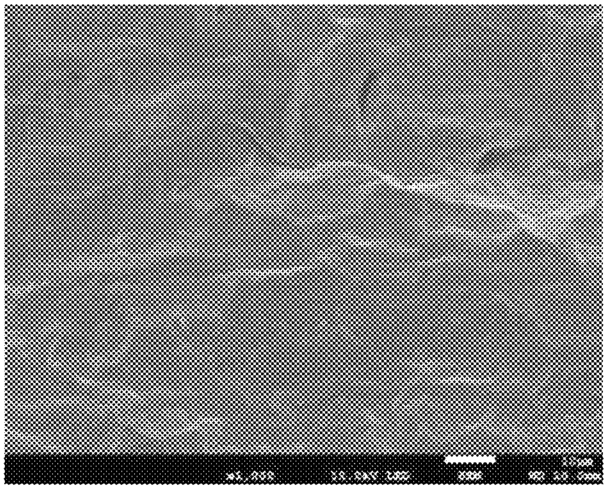
Figure 9C:
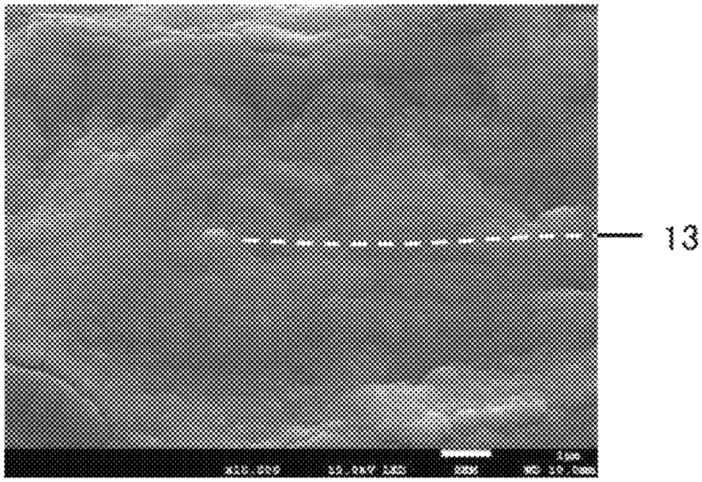

FIG. 9 is a series of surface SEM images of a test corrosion-resistant member obtained in Comparative Example 1 [(a): magnification of 100 times, (b): magnification of 1000 times, (c): magnification of 10000 times].

Figure 10A:
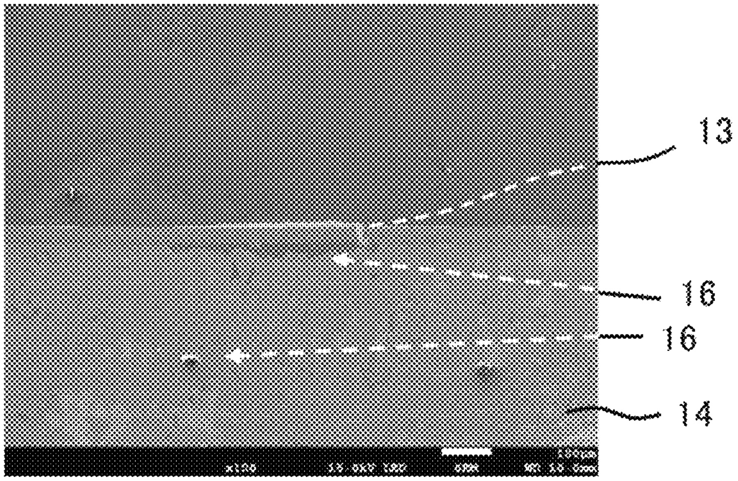
Figure 10B:
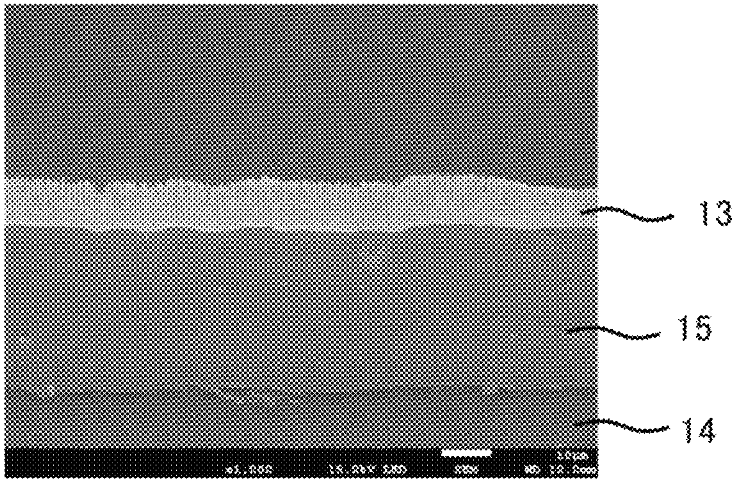
Figure 10C:
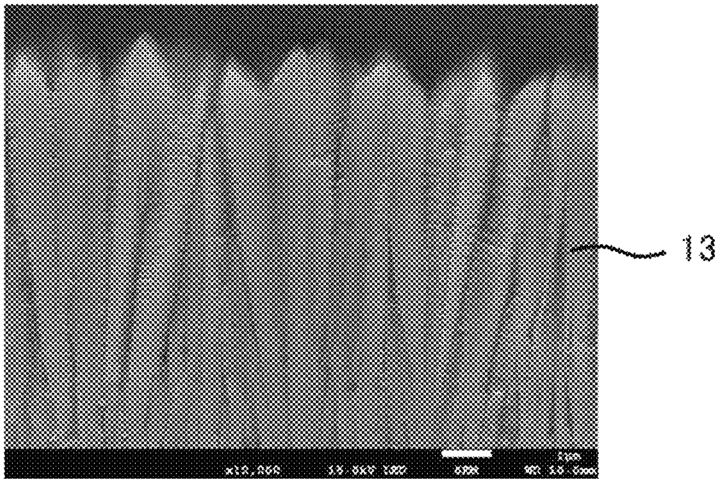

FIG. 10 is a series of cross-sectional SEM images of a test corrosion-resistant member obtained in Comparative Example 2 [(a): magnification of 100 times, (b): magnification of 1000 times, (c): magnification of 10000 times].

Figure 11A:
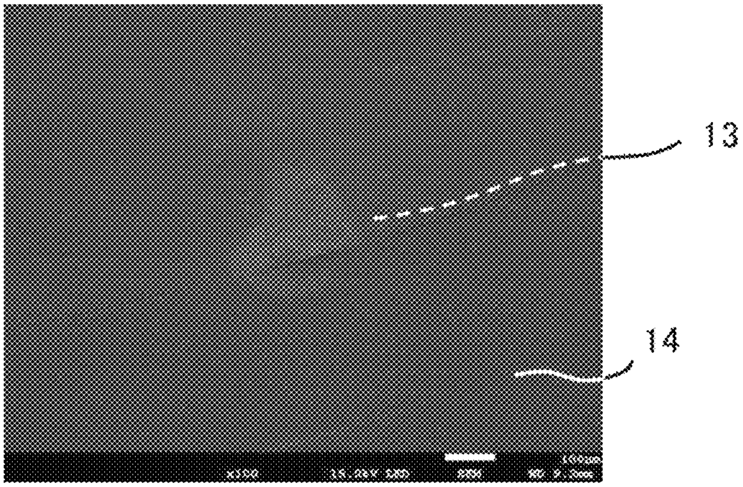
Figure 11B:
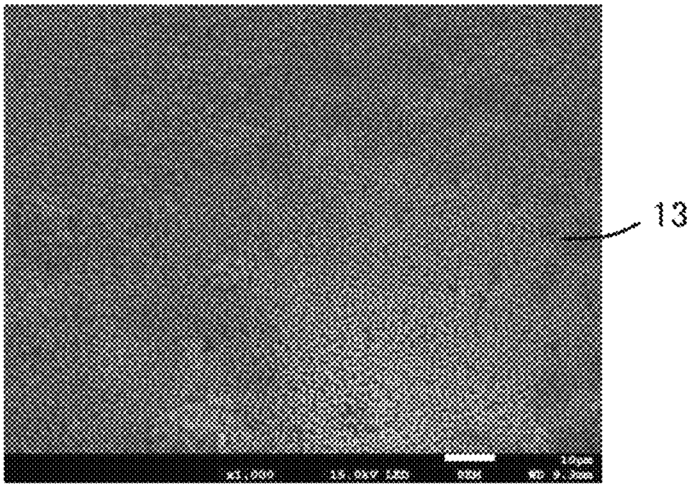
Figure 11C:
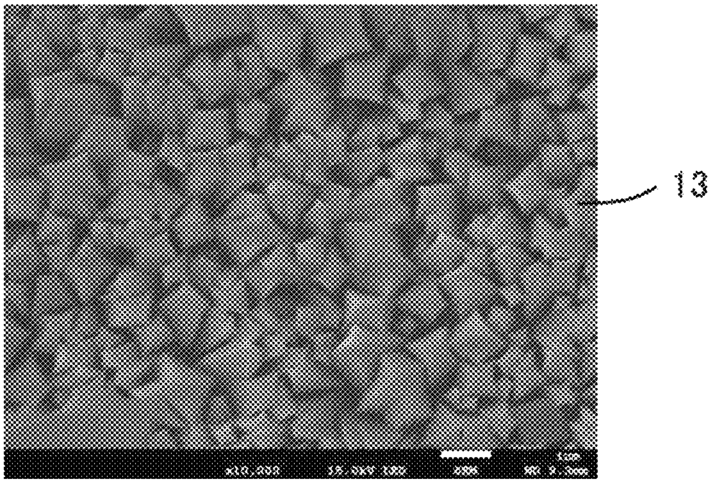

FIG. 11 is a series of surface SEM images of a test corrosion-resistant member obtained in Comparative Example 2 [(a): magnification of 100 times, (b): magnification of 1000 times, (c): magnification of 10000 times].

Figure 12A:
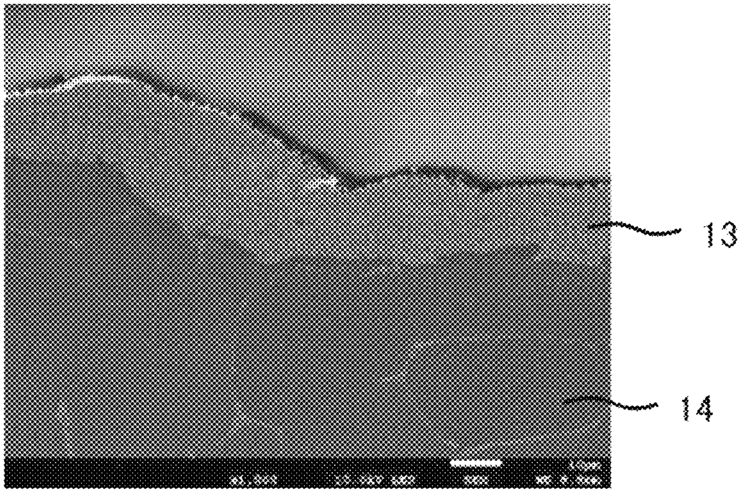
Figure 12B:
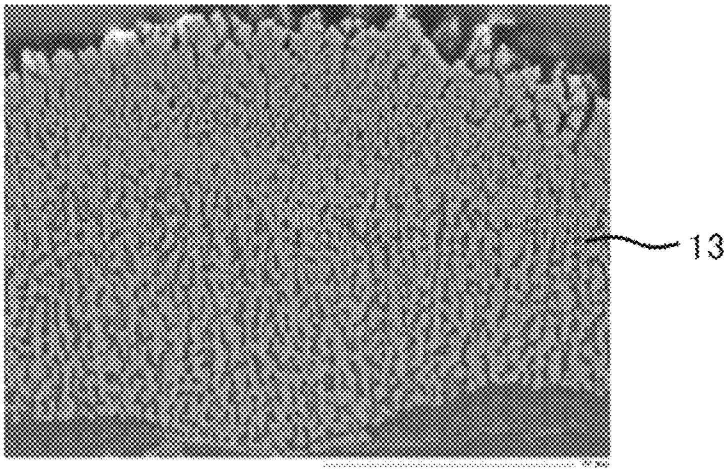

FIG. 12 is a series of cross-sectional SEM images of a test corrosion-resistant member obtained in Comparative Example 4 [(a): magnification of 1000 times, (b): magnification of 10000 times].

Figure 13:
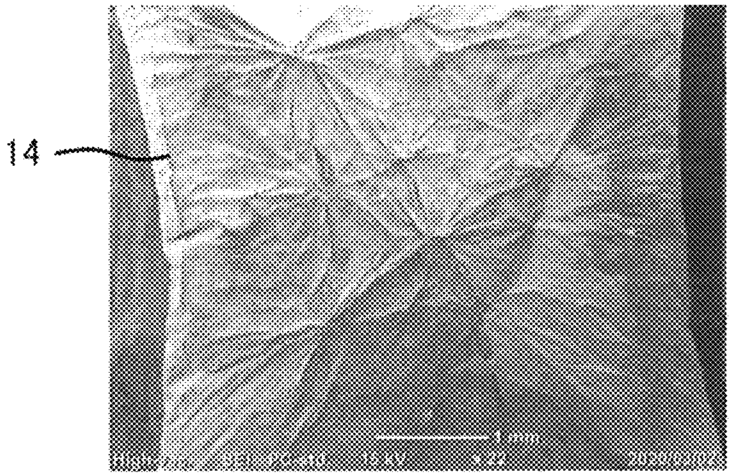

FIG. 13 is a surface SEM image of a test corrosion-resistant member obtained in Comparative Example 4 [magnification: 22 times].

Figure 14:
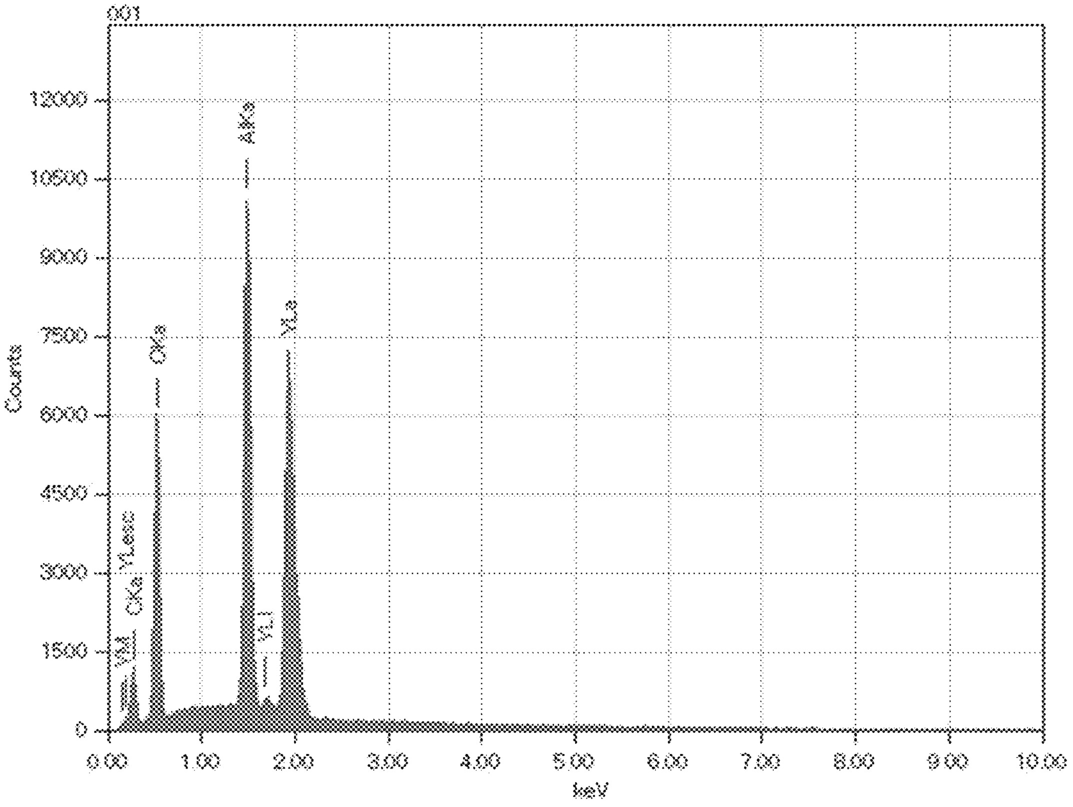

FIG. 14 shows a result of analysis of results of EDX measurement for an yttria coating formed in Comparative Example 4.

DESCRIPTION OF EMBODIMENTS

The following describes the method of the present invention for producing a corrosion-resistant member and the laser CVD device for use in the method in detail. Some or all of components of the present invention that are described in the following can be appropriately combined.

1. Corrosion-Resistant Member

<Substrate>

First, the substrate that is used for the production of a corrosion-resistant member in the present invention consists of aluminum or an aluminum alloy. These are distinguished by their purity, and typically aluminum having a purity of 99.0% or more is regarded as pure aluminum, and aluminum with an additional alloy element as an aluminum alloy. Aluminum alloys are classified by main additional elements into several alloy systems such as 3000 series and 5000 series. Aluminum or an aluminum alloy of appropriate type can be selected for use in view of the application of the corrosion-resistant member and strength required therefor, processability, and the corrosion resistance of the substrate itself.

The substrate may be a processed material obtained by appropriately processing into a desired shape or a composite material or the like obtained by appropriately combining such processed materials. The thickness of the substrate depends on the application of the corrosion-resistant member and cannot be definitely specified, whereas a thickness of about 0.1 mm to 500 mm is typically employed. An oxide film is typically formed on the surface of aluminum or an aluminum alloy. This oxide film may be a natural oxide film naturally formed in the atmosphere, or an anodic oxide film formed through anodic oxidation, or a rolled oxide film formed through hot rolling.

A substrate having an oxide film on the surface or a substrate having no oxide film on the surface may be used as the substrate for use in the production of the corrosion-resistant member. If the substrate has an anodic oxide film formed through anodic oxidation on the surface, the substrate and the corrosion-resistant member each have improved plasma resistance and corrosion resistance. Accordingly, for enhanced plasma resistance and corrosion resistance in the substrate and the corrosion-resistant member, it is preferred to use a substrate having an anodic oxide film on the surface to form an yttria coating on the anodic oxide film. If the substrate has an anodic oxide film on the surface, on the occurrence of burning in forming an yttria coating on the outer surface of the anodic oxide film, the anodic oxide film may peel off because of a vacancy generated between the inner surface of the anodic oxide film and the substrate. Accordingly, for avoiding the peeling-off of the anodic oxide film after the formation of an yttria coating to achieve enhanced adhesion, forming an yttria coating with inhibiting burning is required.

<Yttria Coating>

The yttria coating to be formed on a surface of the substrate consists of yttrium oxide ($Y_2O_3$, yttria), and is formed by means of laser CVD to irradiate the substrate with laser light while the substrate is blown with a raw material gas containing yttrium. The presence of the yttria coating formed on a surface of the substrate can be confirmed, for example, by observing a surface or cross-section of the corrosion-resistant member by means of scanning electron microscopy (SEM). In identification of the yttria coating, for example, the yttria coating can be confirmed from the presence of a peak of the characteristic X-ray of yttrium (Y) and a peak of the characteristic X-ray of O in energy-dispersive X-ray spectroscopy (EDX, EDS).

The thickness of the yttria coating is not particularly limited, but the yttria coating is desired to be thicker for ensuring plasma resistance and corrosion resistance. On the other hand, an upper limit can be set in view of saturation of the effects and economic efficiency. Accordingly, the thickness is preferably 0.1 μm or more, more preferably 1 μm or more, and preferably 100 μm or less, more preferably 10 μm or less.

<Corrosion-Resistant Member>

The corrosion-resistant member obtained in the present invention includes an yttria coating, which is superior in plasma resistance and corrosion resistance, and a substrate consisting of aluminum or an aluminum alloy, which is superior in mechanical processability, heat dissipation properties, and so on, and hence is preferably used for production of parts of semiconductor production devices, in which wafers are processed under exposure to corrosive gas or plasma. Especially, the corrosion-resistant member is particularly preferable for constituent parts of etchers in semiconductor production devices such as plasma etching devices, in which plasma etching is performed, and specific examples include not only electrostatic chucks and deposition shields mentioned above, but also cooling plates, which are used in contact with an electrode, upper walls constituting a part of a chamber, and side jackets. In addition to these, the corrosion-resistant member can be used for various materials including parts and housings of devices for which plasma resistance or corrosion resistance is required.

2. Method for Producing Corrosion-Resistant Member

<Reflectance Reduction Step>

The method of the present invention for producing a corrosion-resistant member may include, prior to a coating formation step, a reflectance reduction step of reducing the reflectance of an irradiation target surface of a substrate to be irradiated with laser light. In this way, the reflectance reduction step and the coating formation step may be performed in the presented order to allow an yttria coating to more reliably grow while the melting of the substrate is inhibited to prevent the occurrence of burning. Specifically, the substrate can more reliably accumulate thermal energy by virtue of the reduced reflectance of the substrate to the laser light to be used in the coating deposition step. In this case, suitably, the reflectance of an irradiation target surface of the substrate to be irradiated with laser light to be used in the coating formation step at the wavelength of the laser light is preferably set to 50% or less, more preferably to 40% or less.

Any technique is available to reduce the reflectance of the irradiation target surface of the substrate without particular limitation, and examples thereof include a method of applying a light-absorbing material that absorbs the laser light onto the irradiation target surface of the substrate, a method of roughening the irradiation target surface of the substrate, and a method of blackening the irradiation target surface of the substrate. In the method of applying a light-absorbing material among them, a near-infrared-light-absorbing material corresponding to the laser to be used can be applied. In the method of roughening the irradiation target surface, for example, roughening treatment can be performed by means of blasting treatment, anodic oxidation treatment, boehmite treatment, or the like. In the method of blackening the irradiation target surface, the irradiation target surface of the substrate can be blackened by subjecting to treatment with application of or soaking in a black dye or a dark coating material, or by subjecting to electrolytic deposition treatment, or the like in which an anodic oxide film formed through anodic oxidation treatment is subjected to secondary electrolysis to electrolytically deposit Ni, Co, or the like.

<Coating Formation Step>

In the method of the present invention for producing a corrosion-resistant member, an yttria coating is formed on a substrate consisting of aluminum or an aluminum alloy by means of what is called laser CVD.

Specifically, an yttria coating is formed on a surface of a substrate consisting of aluminum or an aluminum alloy by irradiating the substrate with laser light in the form of a pulse wave while the substrate is blown with a raw material gas containing yttrium.

In the present invention, the melting of the substrate, which consists of aluminum or an aluminum alloy, can be inhibited to prevent the occurrence of burning with the use of laser light in the form of a pulse wave. Any laser that produces a pulse wave can be used without particular limitation, and, for example, a YAG laser, a $YVO_4$ laser, a semiconductor laser, a fiber laser, an excimer laser, an argon laser, or the like can be used.

Here, for irradiating the substrate with laser light, for example, the following laser conditions can be exemplified. First, the average output is typically 5 to 2000 W, and preferably 10 W or more, more preferably 15 W or more, even more preferably 20 W or more, and preferably 1000 W or less, more preferably 100 W or less, even more preferably 50 W or less. The frequency is typically 1 to 100 kHz, and preferably 10 kHz or more, more preferably 20 kHz or more, and preferably 50 kHz or less, more preferably 40 kHz or less. The pulse width is typically 1 to 1000 ns, and preferably 10 ns or more, more preferably 50 ns or more, even more preferably 100 ns or more, and preferably 500 ns or less, more preferably 300 ns or less, even more preferably 200 ns or less. The peak power is typically 100 W to 30 kW, and preferably 1 kW or more, more preferably 5 kW or more, even more preferably 10 kW or more, and preferably 25 kW or less, more preferably 20 kW or less, even more preferably 15 kW or less. The pulse energy is typically 0.1 to 30 mJ, and preferably 0.5 mJ or more, more preferably 1 mJ or more, even more preferably 2 mJ or more, and preferably 10 mJ or less, more preferably 5 mJ or less, even more preferably 3 mJ or less. The average energy density in laser irradiation (laser irradiation density) is typically 10 to 1000 W/mm$^2$, and preferably 20 W/mm$^2$ or more, more preferably 40 W/mm$^2$ or more, even more preferably 80 W/mm$^2$ or more, and preferably 500 W/mm$^2$ or less, more preferably 200 W/mm$^2$ or less, even more preferably 100 W/mm$^2$ or less. For those conditions, the average output indicates the oscillation output of the laser. The pulse width is a time width per pulse oscillated from the pulse laser. The pulse energy indicates the energy of one pulse contained in the pulse laser beam. The peak power corresponds to a value calculated by dividing the pulse energy by the pulse width (pulse energy≈peak power×pulse width). The average energy density at laser irradiation indicates the average output of the laser emitted per unit area of the irradiation target surface of the substrate to be irradiated with the laser (laser irradiation density=average output/irradiated area).

In the present invention, the temperature of the substrate in the deposition for forming the yttria coating in the coating formation step is typically 300 to 600° C., and preferably 350° C. or more, more preferably 400° C. or more, and preferably 550° C. or less, more preferably 500° C. or less. If the temperature of the substrate in the deposition is less than 300° C., the yttria coating may be insufficiently formed; if the temperature of the substrate in the deposition is more than 600° C., on the other hand, burning may occur because of the melting of the substrate. For the temperature of the substrate in the deposition, it is difficult to directly measure just the temperature of the substrate in a chamber of a CVD device during the deposition. Hence, in the present invention, the surface temperature of the substrate during the deposition is measured from the outside of a chamber with a radiation thermometer, and the value is regarded as the temperature of the substrate in the deposition.

Here, in order to set the temperature of the substrate in the deposition to the aforementioned temperature, it is appropriate to form the yttria coating on the substrate placed on a sample stage in a chamber of a CVD device with the sample stage being under temperature control to have a temperature of 0° C. to 200° C. Specifically, it is preferable to cool the sample stage with a liquid refrigerant, and the resulting temperature is typically 0° C. to 200° C., and preferably 10° C. or more, more preferably 20° C. or more, even more preferably 30° C. or more, and preferably 100° C. or less, more preferably 50° C. or less, even more preferably 40° C. or less.

In forming the yttria coating, the substrate is irradiated with laser light in the form of a pulse wave while the substrate is blown with a raw material gas containing yttrium in such a manner that the substrate is blown with the raw material gas. At that time, an organometal complex containing yttrium can be used as with the case of forming an yttria coating through CVD by a known method. Specifically, for example, an acetylacetonate metal complex such as tris(acetylacetonato)yttrium or a dipivaloylmethane metal complex such as tris(dipivaloylmethanato)yttrium can be preferably used. These react with oxygen such as oxygen gas separately fed to form yttrium oxide (yttria). At that time, the deposition rate for the yttria coating is not particularly limited, and is typically 10 to 1000 μm/Hr because laser CVD is used, and preferably 100 μm/Hr or more, more preferably 200 μm/Hr or more, and preferably 500 μm/Hr or less, more preferably 400 μm/Hr or less.

<Laser CVD Device>

Examples of preferred laser CVD devices applicable as a laser CVD device for use in the method of the present invention for producing a corrosion-resistant member include, but are not particularly limited to, the following one: a laser CVD device including: a vacuum chamber; a sample stage on which a substrate is placed in the vacuum chamber; a gas-feeding unit that feeds a raw material gas to the substrate; a laser unit that irradiates the substrate with laser light via an optical window attached to the vacuum chamber; and a cooling unit that cools the sample stage via a refrigerant.

Figure 1:
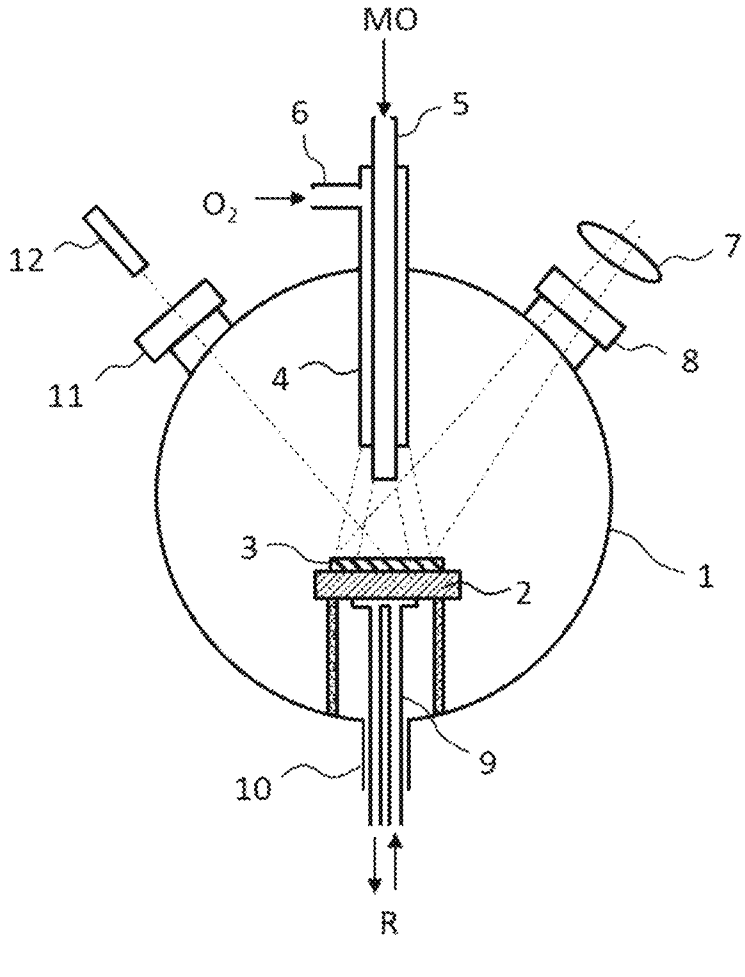
FIG. 1 is a schematic diagram for describing a preferable laser CVD device for use in the method of the present invention for producing a corrosion-resistant member.

FIG. 1 illustrates an embodiment of the preferred laser CVD device. In this laser CVD device, a substrate 3 consisting of aluminum or an aluminum alloy is placed on a sample stage 2 in a vacuum chamber 1, and a gas-feeding unit 4 having a raw-material-feeding pipe 5 from which an organometal complex containing yttrium (MO) is fed and an oxygen-feeding pipe 6 from which oxygen ($O_2$) is fed feeds a raw material gas containing them. The laser CVD device is provided with a laser unit 7 that emits laser light in the form of a pulse wave, and the laser light emitted from this passes through an optical window 8 to reach the substrate 3. At that time, the optical window 8, which has lens functions, diverges the laser light emitted from the laser unit 7, giving a relatively large deposition area to a surface of the substrate 3. The laser CVD device includes a cooling unit 9 that cools the sample stage 2 with a liquid or gas refrigerant (R) flowing therein, allowing the substrate 3 in the deposition to be under control to have a proper temperature. In addition, the vacuum chamber 1 in the laser CVD device is provided with an exhaust port 10 connected to a decompression unit (out of the figure) to reduce the pressure in the vacuum chamber 1 and a measurement window 11 to measure the temperature of the substrate 3 in the deposition with a radiation thermometer 12.

To produce a corrosion-resistant member by forming an yttria coating on a surface of a substrate consisting of aluminum or an aluminum alloy with this laser CVD device, first, the substrate 3 is placed on the sample stage 2 at a predetermined position. The temperature of the substrate 3 placed on the sample stage 2 is set to a specific temperature with the cooling unit 9, and then an organometal complex (MO) preheated to a specific temperature is jetted together with Ar gas as a carrier gas from the raw-material-feeding pipe 5. At that time, a liquid refrigerant (water) cooled with an external chiller or the like can be circulated in the cooling unit 9. At the same time, oxygen ($O_2$) is jetted from the oxygen-feeding pipe 6. Through this process, a surface of the substrate 3 is blown with a mixed gas (raw material gas) as a mixture of those materials.

Subsequently, simultaneously with blowing the surface of the substrate 3 with the mixed gas, the substrate 3 is irradiated with laser light in the form of a pulse wave from a laser unit 7 such as a fiber laser via the optical window 8 of the vacuum chamber 1. At that time, when the mixed gas with which the surface of the substrate 3 has been blown is irradiated with the laser light, the organometal complex containing yttrium is activated through local heating, and reacts with oxygen to crystalize on the surface of the substrate 3. These crystals grow to form an yttria coating having a specific thickness on the surface of the substrate 3. At that time, the substrate 3 placed on the sample stage 2 is cooled by the cooling unit 9, and the cooling in combination with the pulse oscillation from the laser unit 7 allows the substrate 3 to be under control to have a specific temperature (300° C. to 600° C.). At that time, the temperature of the substrate 3 in the deposition is measured with the radiation thermometer 12, and the measurement result may be used for adjustment of, for example, the output of the laser unit 7 or the refrigerant temperature of the cooling unit 9. An excessive portion of the gas in the vacuum chamber 1 during the deposition is exhausted from the exhaust port 10 to the outside.

3. Operations and Effects

In the method of the present invention for producing a corrosion-resistant member, a surface of the substrate, which consists of aluminum or an aluminum alloy, is irradiated with laser light consisting of a pulse wave, and as a result high energy is instantaneously given to the raw material gas and the growth of yttria crystals is promoted. At that time, as a result of the use of a pulse wave, the substrate is intermittently irradiated with the laser light and subjected to repeated heating and cooling. Thus, even if the laser output is comparable to that in the case of a continuous wave, the substrate can receive heat from the laser light while allowing an yttria coating to grow on the surface of the substrate with the heat inhibited from propagating to the inside of the substrate, and hence the occurrence of burning, a phenomenon that the substrate melts and a vacancy is formed in the inside of the substrate, can be prevented. In this way, the present invention enables production of a corrosion-resistant member having improved plasma resistance and corrosion resistance even with a substrate consisting of a material having a relatively low melting point such as aluminum or an aluminum alloy through the formation of an yttria coating with the melting inhibited. In addition, the present invention enables production of a corrosion-resistant member with a substrate consisting of aluminum or an aluminum alloy, the substrate having satisfactory mechanical processability and heat dissipation properties, and thus production of a corrosion-resistant member having a desired shape or being superior in heat dissipation properties.

EXAMPLES

The following describes preferred embodiments of the present invention in detail with Examples, Comparative Examples, and test examples, but the description should not be construed as limitation of the present invention thereto.

Example 1

A test substrate of 1 mm in thickness×30 mm in width×30 mm in length was cut out of A5052 aluminum alloy treated according to the temper designation H34 (A5052-H34) shown in JIS H0001, and a test corrosion-resistant member according to the present invention was produced by means of laser CVD as follows.

Figure 2:
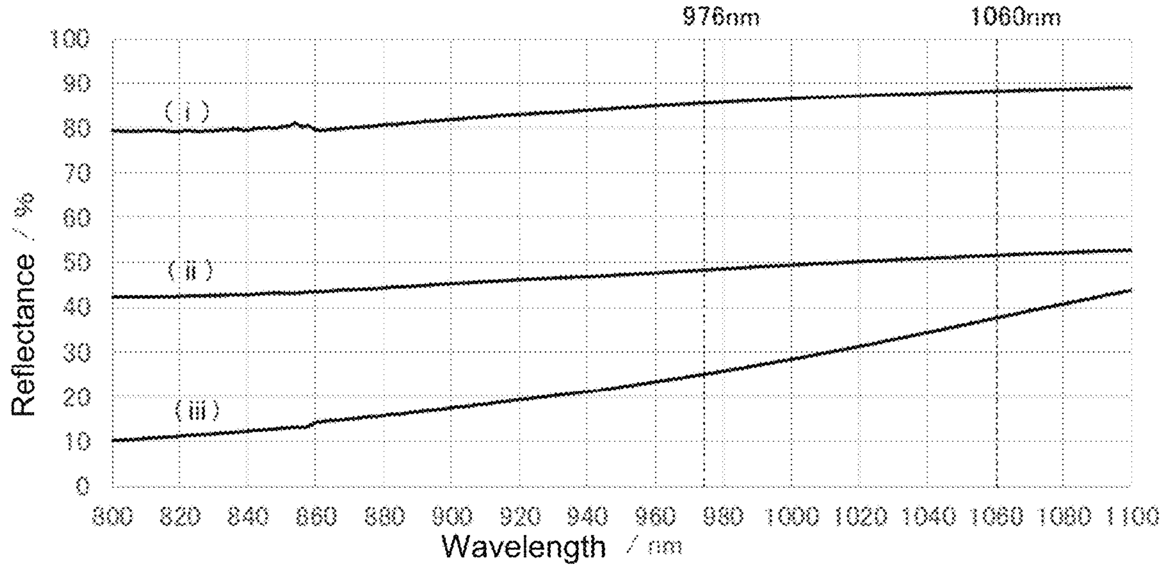
FIG. 2 shows results of determination of reflected light spectra in a wavelength region of 800 to 1100 nm for test substrates used in Examples.

First, as a reflectance reduction step, an irradiation target surface of the test substrate to be irradiated with laser light was blackened by coloring with a marker to reduce the reflectance. The resulting reflectance at 1060 nm, which is the wavelength of a Yb fiber laser to be used for a laser CVD device described later, was 37.6% as shown in FIG. 2. In the measurement of the reflectance, a reflected light spectrum in the wavelength region of 800 to 1100 nm was determined using a spectrophotometer (Perkin Elmer LAMBDA 750S), and reflectance at a wavelength of 976 nm and that at a wavelength of 1060 nm were identified, and the same procedure was applied to test substrates of Example 2 and the subsequent examples as well. FIG. 2 shows: (i) the reflectance for the case that the A5052-H34 was degreased with ethanol; (ii) the reflectance for the case that a sulfuric acid anodic oxide film was formed on the A5052-H34; and (iii) the reflectance for the case that the A5052-H34 was colored black with a marker.

Subsequently, the blackened test substrate was placed on a sample stage of a laser CVD device. The laser CVD device used in Examples was of vertical cold-wall type as previously shown in FIG. 1, and in this case the laser unit 7 included a Yb fiber laser (wavelength: λ=1059 to 1065 nm) as a laser oscillator. In addition, the laser CVD device included a cooling unit 9 capable of cooling the sample stage 2 via a refrigerant. The laser unit 7 used here was a TRUMPF redENERGY G4 20 W HS-L (manufactured by the former SPI Lasers).

The test substrate 3 placed on the sample stage 2 was cooled in advance with the cooling unit 9, and an organometal complex (MO): $Y(C_{11}H_{19}O_2)_3$[tris(dipivaloylmethanato)yttrium] that had been heated to a specific temperature to be vaporized was jetted together with Ar gas as a carrier gas from the raw-material-feeding pipe 5 toward a surface of the substrate 3. At the same time, oxygen ($O_2$) was jetted from the oxygen-feeding pipe 6. This configuration allowed the surface of the substrate 3 to be blown with a mixed gas (raw material gas) as a mixture of those raw materials.

Subsequently, simultaneously with blowing the surface of the test substrate 3 with the mixed gas, the test substrate 3 was irradiated with laser light in the form of a pulse wave from the laser unit 7, which included a Yb fiber laser as a laser oscillator, via an optical window 8. At that time, the cooling of the sample stage 2 with the cooling unit 9 in combination with the pulse oscillation from the laser unit 7 allowed the test substrate 3 to keep a specific temperature with the temperature increase of the test substrate 3 inhibited in the formation of an yttria coating, and the temperature of the test substrate 3 at that time was measured with the radiation thermometer 11. Then, while the pressure in the vacuum chamber 1 was reduced to a specific pressure by exhausting an excessive portion of the gas in the vacuum chamber 1 in the deposition from the exhaust port 10 to the outside, a coating formation step was performed to form an yttria coating on the surface of the test substrate 3. Details of the laser conditions and deposition conditions in the coating formation step and the deposition result were as shown below. The peak power and pulse energy of the laser conditions are based on a data sheet for the laser unit. The deposition result is based on observation by cross-sectional SEM. For the measurement of the temperature of the test substrate in the deposition, a radiation thermometer (FLHX-TNN0220L0500S3.2-000 manufactured by JAPANSENSOR CORPORATION) was used. In the measurement, the emissivity of the aluminum alloy (A5052-H34) was employed irrespective of the condition of the surface of the test substrate and an emissivity of 0.2 was set, and the temperature of a part of the test substrate with the occurrence of deposition was measured. The measurement range of the radiation thermometer in the measurement was φ3.2 mm.

[Laser Conditions]

Laser oscillator: Yb fiber laser (wavelength: λ=1059 to 1065 nm)
Oscillation form: pulse wave
Average output: 16 W
Frequency: 27 kHz
Pulse width: 200 ns
Peak power: 12 KW or more
Pulse energy: 0.8 mJ or more
Laser irradiation diameter: 0.5 mm
Laser irradiation density: 81.53 W/mm$^2$

[Deposition Conditions]

Temperature of liquid refrigerant in cooling unit: 20° C.
Vaporization temperature of organometal complex: 190° C.
Deposition time: 5 min
Flow rate of oxygen gas: 100 sccm
Flow rate of Ar gas: 100 sccm
Pressure in vacuum chamber: 200 Pa
Temperature of test substrate in deposition: 420° C.

[Deposition Result]

Figure 3A:
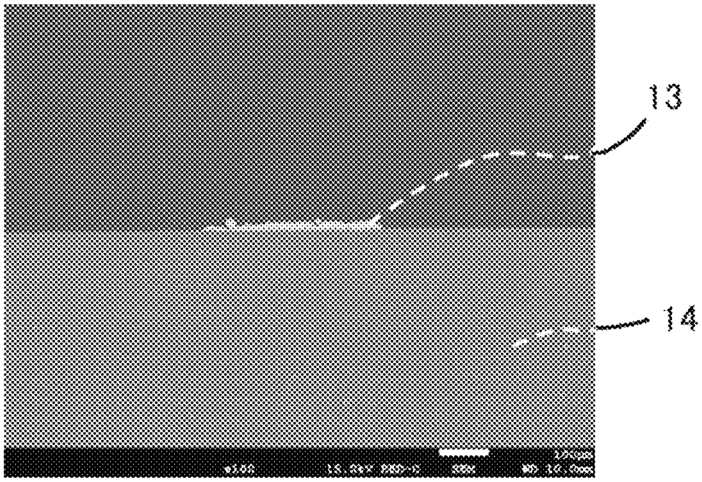
FIG. 3 is a series of cross-sectional SEM images of a test corrosion-resistant member obtained in Example 1 [(a): magnification of 100 times, (b): magnification of 1000 times, (c): magnification of 5000 times].
Figure 3B:
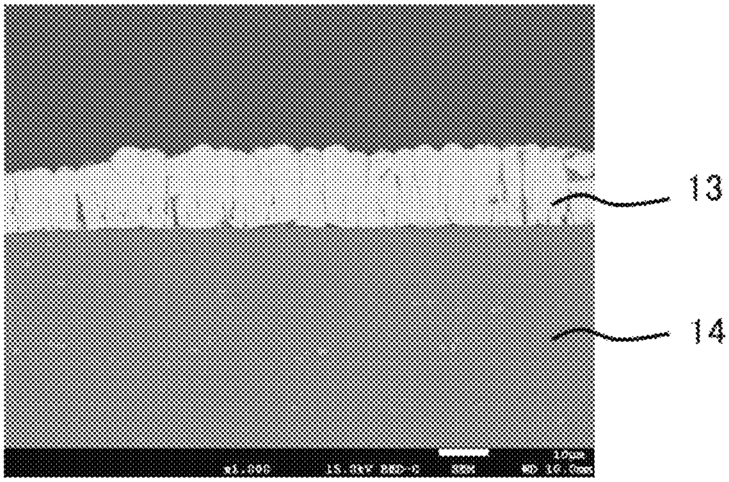
Figure 3C:
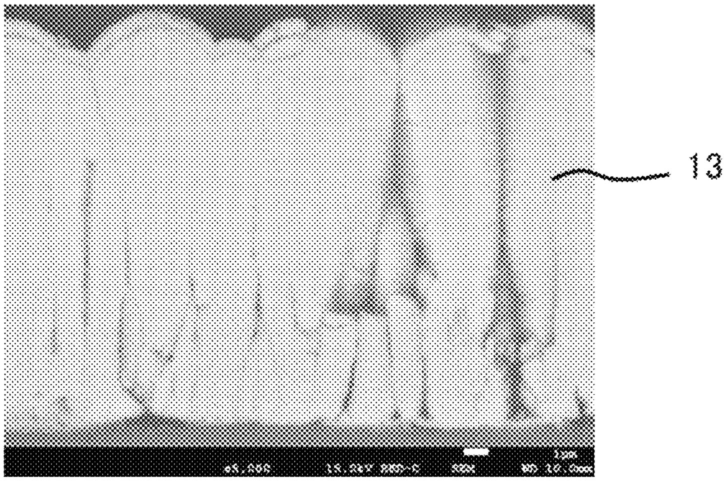
Figure 4A:
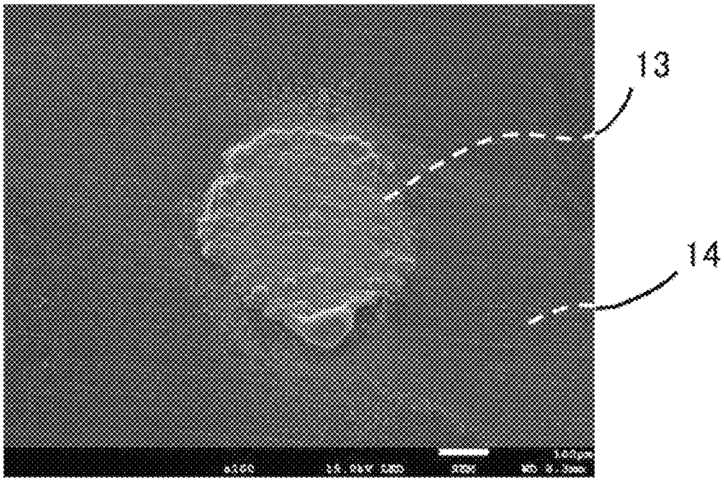
FIG. 4 is a series of surface SEM images of a test corrosion-resistant member obtained in Example 1 [(a): magnification of 100 times, (b): magnification of 1000 times, (c): magnification of 10000 times].
Figure 4B:
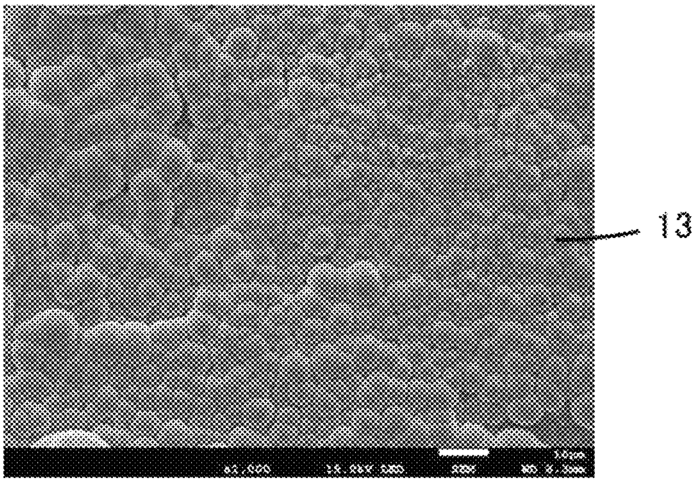
Figure 4C:
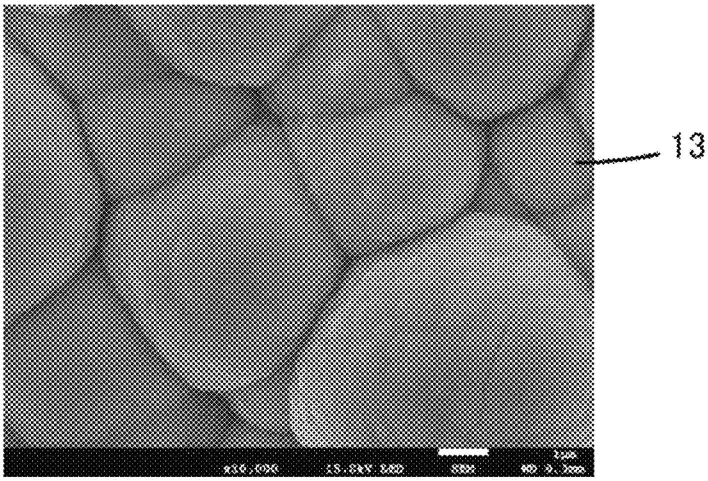

Thickness of yttria coating: 19 μm
Deposition rate: 228 μm/Hr
Form of yttria coating: lamination of fine crystal grains
Melting of test substrate: absent For the test corrosion-resistant member obtained through the reflectance reduction step and the coating formation step, FIG. 3 shows the cross-sectional SEM image as the cross-section was observed, and FIG. 4 shows the surface SEM image as the surface in the yttria coating side was observed. From FIG. 4(*a*) (magnification: 100 times) among them, the formation of the yttria coating 13 can be found in a range in the size corresponding to the irradiation diameter of the laser light. From FIGS. 4(*b*) (magnification: 1000 times) and 4(*c*) (magnification: 10000 times), it can be seen that the yttria coating 13 was formed of objects like fine crystal grains. Moreover, FIGS. 3(*b*) (magnification: 1000 times) and 3(*c*) (magnification: 5000 times) show that fine crystal grains were stacking in the yttria coating 13 formed on the test substrate 14. From FIGS. 3(*a*) (magnification: 100 times) and 3(*b*), it can be found that the test substrate 14 with the yttria coating 13 formed thereof did not undergo the occurrence of burning due to melting.

Figure 5:
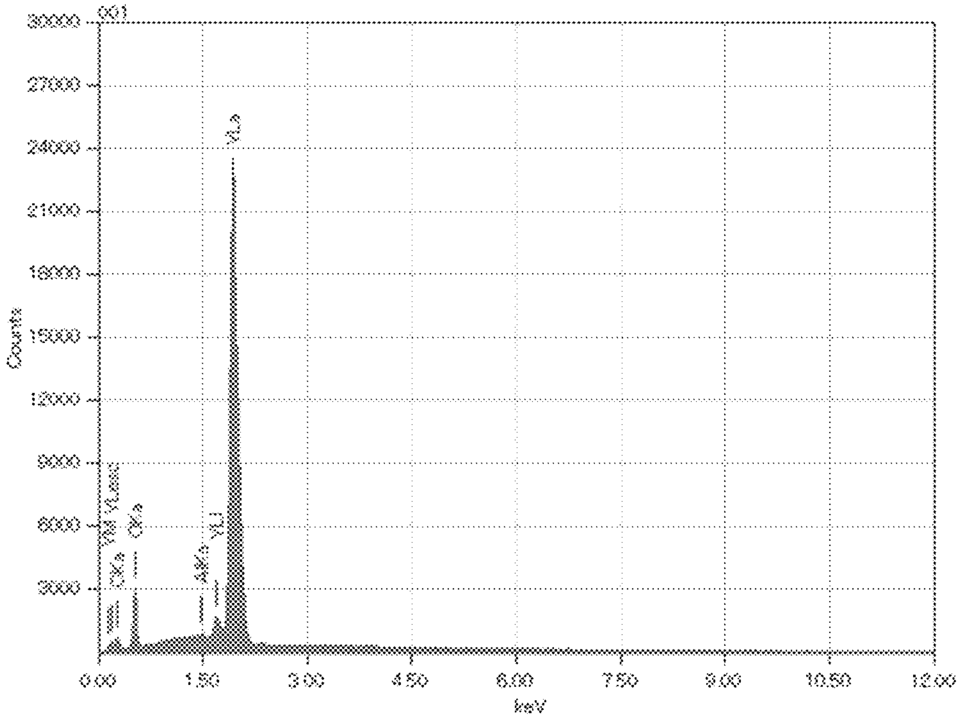
FIG. 5 shows results of EDX measurement for an yttria coating formed in Example 1.

FIG. 5 shows results of EDX measurement for the yttria coating formed above. Analysis of the crystal grains forming the yttria coating, which have been presented in FIG. 4(*c*), confirmed the presence of a peak of the characteristic X-ray of yttrium (Y) and a peak of the characteristic X-ray of oxygen (O) as demonstrated in FIG. 5, and hence it is understood that the substance formed on the test substrate was yttrium oxide (yttria). A peak derived from carbon (C) is found in FIG. 5, and this is probably because part of carbon constituting the organometal complex contained in the raw material gas was detected.

Example 2

A5052-H34 of 4 mm in thickness×30 mm in width×30 mm in length was used as a test substrate. This was blackened by coloring with a marker in the same manner as in Example 1 to give a reflectance of 37.6% at 1060 nm, which is the wavelength of a Yb fiber laser. The test substrate was placed on the sample stage of the laser CVD device in the same manner as in Example 1, and an yttria coating was formed on a surface of the test substrate 3 in the same manner as in Example 1 except that laser conditions and deposition conditions shown below were applied. The deposition result is shown in combination with the laser conditions and others.

[Laser Conditions]

Laser oscillator: Yb fiber laser (wavelength: =1059 to 1065 nm)
Oscillation form: pulse wave Average output: 16 W
Frequency: 33 kHz
Pulse width: 100 ns
Peak power: 12 KW or more
Pulse energy: 0.8 mJ or more
Laser irradiation diameter: 0.5 mm
Laser irradiation density: 81.53 W/mm$^2$

[Deposition Conditions]
Temperature of liquid refrigerant in cooling unit: 20° C.
Vaporization temperature of organometal complex: 190° C.
Deposition time: 5 min
Flow rate of oxygen gas: 100 sccm
Flow rate of Ar gas: 100 sccm
Pressure in vacuum chamber: 200 Pa
Temperature of test substrate in deposition: 493° C.

Figure 6A:
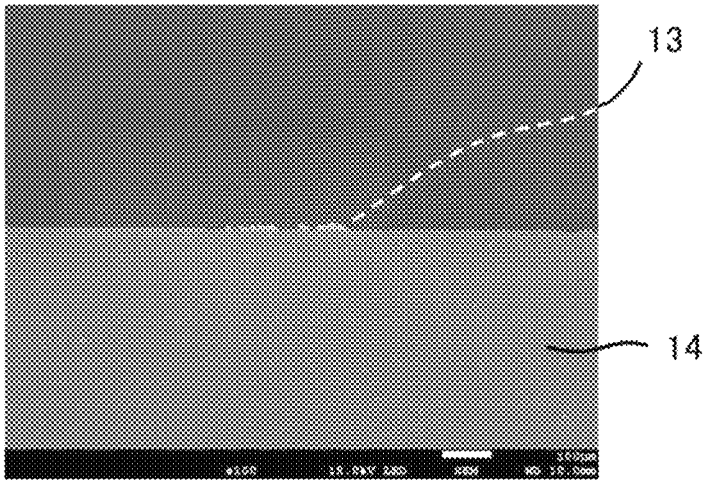
FIG. 6 is a series of cross-sectional SEM images of a test corrosion-resistant member obtained in Example 2 [(a): magnification of 100 times, (b): magnification of 1000 times, (c): magnification of 5000 times].
Figure 6B:
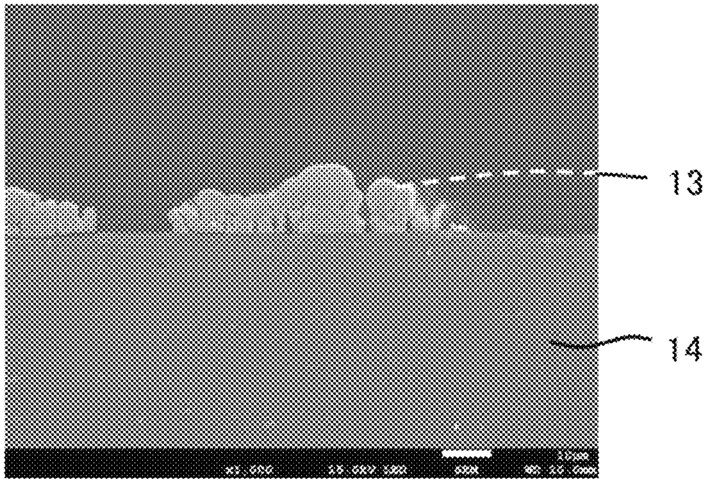
Figure 6C:
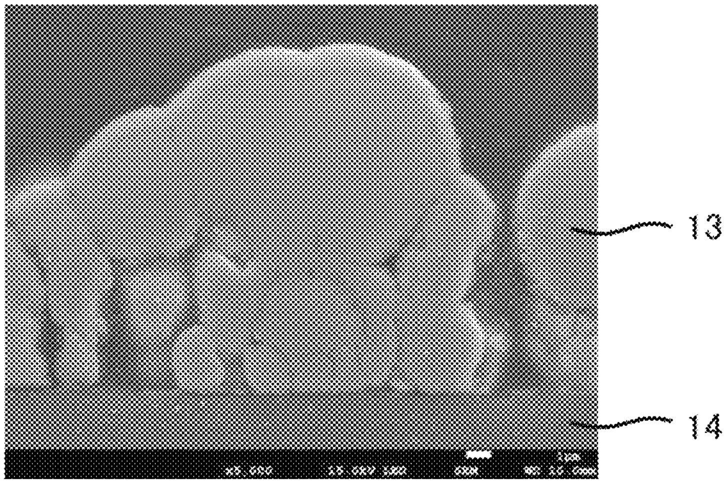
Figure 7A:
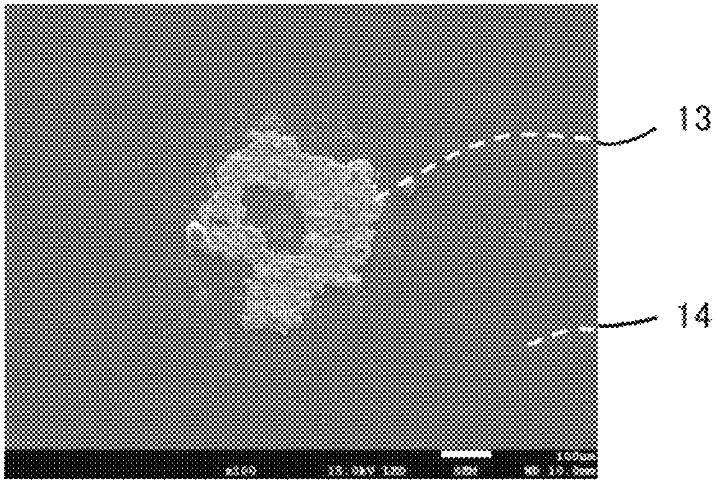
FIG. 7 is a series of surface SEM images of a test corrosion-resistant member obtained in Example 2 [(a)
Figure 7B:
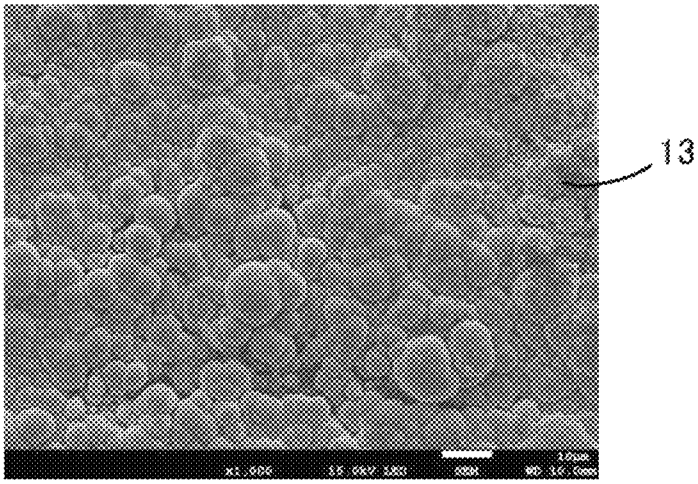
Figure 7C:
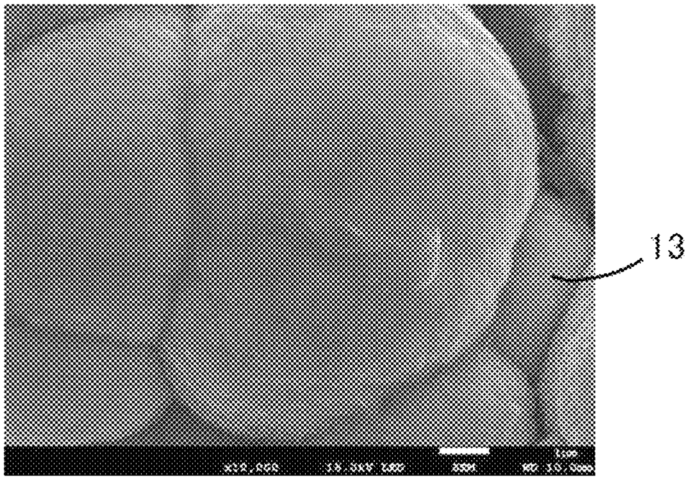

[Deposition Result]
Thickness of yttria coating: 14 μm
Deposition rate: 170 μm/Hr
Form of yttria coating: lamination of fine crystal grains
Melting of test substrate: absent For the test corrosion-resistant member obtained above, FIG. 6 shows the cross-sectional SEM image as the cross-section was observed, and FIG. 7 shows the surface SEM image as the surface in the yttria coating side was observed. From FIG. 7(*a*) (magnification: 100 times) among them, some parts without the growth of the yttria coating were found, but the yttria coating 13 was formed in a range in the size corresponding to the irradiation diameter of the laser light as with Example 1. From FIGS. 6(*b*) (magnification: 1000 times) and 6(*c*) (magnification: 10000 times), it can be seen that objects like fine crystal grains were stacking in the yttria coating 13. From FIGS. 6(*a*) (magnification: 100 times) and 6(*b*), it can be found that the test substrate 14 with the yttria coating 13 formed thereof did not undergo the occurrence of burning due to melting.

Comparative Example 1

A5052-H34 of 1 mm in thickness×5 mm in width×5 mm in length was used as a test substrate. The test substrate was degreased in advance with ethanol without being subjected to a reflectance reduction step, and placed on the sample stage of the laser CVD device in the same manner as in Example 1. In Comparative Example 1, a semiconductor laser that produces a continuous wave was used as a laser oscillator of the laser CVD device, and the reflectance of the test substrate degreased with ethanol at 976 nm, which is the wavelength of the semiconductor laser, was 85.78. Then, a coating formation step according to Comparative Example 1 was performed in the same manner as in Example 1 except that laser conditions and deposition conditions shown below were applied. The deposition result is shown in combination with the laser conditions and others.

[Laser Conditions]
Laser oscillator: semiconductor laser (wavelength: λ=976 nm)
Oscillation form: continuous wave
Output: 38 W
Laser irradiation diameter: 5 mm
Laser irradiation density: 1.94 W/mm$^2$

[Deposition Conditions]
Temperature of liquid refrigerant in cooling unit: 15° C.
Vaporization temperature of organometal complex: 190° C.
Deposition time: 5 min
Flow rate of oxygen gas: 100 sccm
Flow rate of Ar gas: 100 sccm
Pressure in vacuum chamber: 200 Pa
Temperature of test substrate in deposition: 710° C.

[Deposition Result]
Thickness of yttria coating: 0.4 μm
Deposition rate: 5 μm/Hr
Form of yttria coating: lamination of fine crystal grains
Melting of test substrate: present For the test corrosion-resistant member obtained above, FIG. 8 shows the cross-sectional SEM image as the cross-section was observed, and FIG. 9 shows the surface SEM image as the surface was observed. From FIG. 8(*c*) and FIG. 9(*c*) (magnification: 10000 times in both figures) among them, the presence of the yttria coating 13 can be found, but the presence of the yttria coating cannot be sufficiently found from FIG. 8(*a*) and FIG. 9(*a*) (magnification: 100 times in both figures) and FIG. 8(*b*) and FIG. 9(*b*) (magnification of 1000 times in both figures); thus, the formation of the yttria coating 13 on the surface of the test substrate 14 was slight. In fact, FIG. 8(*a*) revealed that burning due to the melting of the test substrate 14 occurred to form many vacancies 16 in the test substrate 14. The melting mentioned above occurred in Comparative Example 1 probably because the temperature of the test substrate reached 710° C. during the deposition through the irradiation with the laser light in the form of a continuous wave.

Comparative Example 2

A5052-H34 of 1 mm in thickness×5 mm in width×5 mm in length was used as a test substrate. As a reflectance reduction step, the test substrate was subjected to roughening treatment by anodic oxidation with sulfuric acid to provide a sulfuric acid anodic oxide film having a thickness of 34 μm. The resulting reflectance at 1060 nm, which is the wavelength of a Yb fiber laser to be used in the laser CVD device in Comparative Example 2, was 51.6%.

Subsequently, the roughened test substrate was placed on the sample stage of the laser CVD device in the same manner as in Example 1. In Comparative Example 2, a Yb fiber laser that produces a continuous wave was used as a laser oscillator of the laser CVD device. Then, a coating formation step was performed in the same manner as in Example 1 except that laser conditions and deposition conditions shown below were applied. The deposition result is shown in combination with the laser conditions and others.

[Laser Conditions]
Laser oscillator: Yb fiber laser (wavelength: λ=1059 to 1065 nm)
Oscillation form: continuous wave
Output: 8 W
Laser irradiation diameter: 0.5 mm
Laser irradiation density: 40.76 W/mm$^2$

[Deposition Conditions]
Temperature of liquid refrigerant in cooling unit: 15° C.
Vaporization temperature of organometal complex: 190° C.
Deposition time: 5 min
Flow rate of oxygen gas: 100 sccm
Flow rate of Ar gas: 100 sccm
Pressure in vacuum chamber: 200 Pa
Temperature of test substrate in deposition: 630° C.

[Deposition Result]
Thickness of yttria coating: 9.7 μm
Deposition rate: 117 μm/Hr
Form of yttria coating: columnar crystals Melting of test substrate: present For the test corrosion-resistant member obtained above, FIG. 10 shows the cross-sectional SEM image as the cross-section was observed, and FIG. 11 shows the surface SEM image as the surface was observed. From FIG. 11(*a*) (magnification: 100 times) among them, it can be found that the yttria coating 13 was formed in a range in the size corresponding to the irradiation diameter of the laser light. From FIGS. 10(*b*) (magnification: 1000 times) and 10(*c*) (magnification: 10000 times) and FIGS. 11(*b*) (magnification: 1000 times) and 11(*c*) (magnification: 10000 times), it can be seen that the yttria coating was formed of an assembly of fine columnar crystals. On the other hand, FIG. 10(*a*) (magnification: 100 times) revealed that the test substrate 14 with the formation of the yttria coating 13 underwent the occurrence of burning due to melting, a part of the interface between the anodic oxide film 15 with the yttria coating 13 formed thereon and the test substrate 14 swelled to form vacancies 16, and vacancies 16 were formed even in the inside of the test substrate 14. The melting mentioned above occurred also in Comparative Example 2 probably because the temperature of the test substrate reached 630° C. during the deposition through the irradiation with the laser light in the form of a continuous wave.

Comparative Example 3

A5052-H34 of 1 mm in thickness×30 mm in width×30 mm in length was used as a test substrate. The test substrate was degreased in advance with ethanol without being subjected to a reflectance reduction step, and placed on the sample stage of the laser CVD device in the same manner as in Example 1. In Comparative Example 3, a Yb fiber laser that produces a pulse wave was used as a laser oscillator of the laser CVD device, and the reflectance of the test substrate degreased with ethanol at 1060 nm, which is the wavelength of the Yb fiber laser, was 88.4%. Then, a coating formation step was performed in the same manner as in Example 1 except that laser conditions and deposition conditions shown below were applied. The deposition result is shown in combination with the laser conditions and others.

[Laser Conditions]

Laser oscillator: Yb fiber laser (wavelength: λ=1059 to 1065 nm)

Oscillation form: pulse wave

Average output: 16 W

Frequency: 27 kHz

Pulse width: 200 ns

Peak power: 12 KW or more

Pulse energy: 0.8 mJ or more

Laser irradiation diameter: 0.5 mm

Laser irradiation density: 81.53 W/mm$^2$

[Deposition Conditions]

Temperature of liquid refrigerant in cooling unit: 20° C.

Vaporization temperature of organometal complex: 190° C.

Deposition time: 5 min

Flow rate of oxygen gas: 100 sccm

Flow rate of Ar gas: 100 sccm

Pressure in vacuum chamber: 200 Pa

Temperature of test substrate in deposition: 280° C.

[Deposition Result]

Thickness of yttria coating: N/A (deposition failed)

Deposition rate: N/A (deposition failed)

Form of yttria coating: N/A (deposition failed)

Melting of test substrate: absent

The result showed that no yttria coating was formed on the surface of the test substrate. The result in Comparative Example 3 is probably because sufficient increase in the temperature of the test substrate was not achieved during the deposition because of the use of the laser that produces a pulse wave as well as the excessively high reflectance of the test substrate to the laser light.

Comparative Example 4

A test substrate of 1 mm in thickness×5 mm in width×5 mm in length was cut out of A1050 aluminum alloy treated according to the temper designation H24 (A1050-H24) shown in JIS H0001, and this test substrate was used. The test substrate was degreased in advance with ethanol without being subjected to a reflectance reduction step, and placed on the sample stage of the laser CVD device in the same manner as in Example 1. In Comparative Example 4, a semiconductor laser that produces a continuous wave was used as a laser oscillator of the laser CVD device, and the reflectance of the test substrate degreased with ethanol at 976 nm, which is the wavelength of the semiconductor laser, was 85.7%. No cooling unit to cool the sample stage was provided with the laser CVD device in Comparative Example 4. Then, a coating formation step was performed in the same manner as in Example 1 except that laser conditions and deposition conditions shown below were applied. The deposition result is shown in combination with the laser conditions and others.

[Laser Conditions]

Laser oscillator: semiconductor laser (wavelength: λ=976 nm)

Oscillation form: continuous wave

Output: 64 W

Laser irradiation diameter: 5 mm

Laser irradiation density: 3.26 W/mm$^2$

[Deposition Conditions]

Temperature of liquid refrigerant in cooling unit: N/A (without cooling unit)

Vaporization temperature of organometal complex: 190° C.

Deposition time: 10 min

Flow rate of oxygen gas: 100 sccm

Flow rate of Ar gas: 100 sccm

Pressure in vacuum chamber: 200 Pa

Temperature of test substrate in deposition: 780° C.

[Deposition Result]

Thickness of yttria coating: 17 μm

Deposition rate: 102 μm/Hr

Form of yttria coating: lamination of fine crystal grains

Melting of test substrate: present

For the test corrosion-resistant member obtained above, FIG. 12 shows the cross-sectional SEM image as the cross-section was observed, and FIG. 13 shows the surface SEM image as the surface was observed. From FIG. 12(*a*) (magnification: 1000 times) and FIG. 12(*b*) (magnification: 10000 times) among them, the presence of the yttria coating 13 formed of stacking objects like fine crystal grains was found. However, from FIG. 13 (magnification: 22 times), it was found that the test substrate 14 with the yttria coating 13 formed thereon underwent the occurrence of burning due to melting, and the test substrate 14 was largely deformed. FIG. 14 shows results of EDX measurement for the yttria coating formed above. As demonstrated in FIG. 14, although a peak of the characteristic X-ray of yttrium (Y) and a peak of the characteristic X-ray of oxygen (O) were present, a stronger peak of the characteristic X-ray of aluminum (Al) was found. These results suggest that yttrium oxide (yttria) was formed on the test substrate 14, but not as a dense film covering the surface of the test substrate. The melting mentioned above occurred in Comparative Example 4 probably because the temperature of the test substrate reached 780° C. during the deposition because of the unuse of a cooling unit and the irradiation with the laser light in the form of a continuous wave.

As described above, the present invention enables the formation of an yttria coating with a substrate consisting of aluminum or an aluminum alloy, wherein the substrate is prevented from melting and thus inhibited from burning through deposition with the substrate being under temperature control to have a specific temperature by using a pulse laser that produces a pulse wave. Accordingly, the present invention enables production of a corrosion-resistant member superior in plasma resistance and corrosion resistance with a substrate consisting of aluminum or an aluminum alloy, and the resulting corrosion-resistant member is very preferable as a material for parts and housings to be used under an environment involving exposure to corrosive gas and plasma such as the inside of a semiconductor production device.

REFERENCE SIGNS LIST

1: vacuum chamber, 2: sample stage, 3: substrate, 4: gas-feeding unit, 5: raw-material-feeding pipe, 6: oxygen-feeding pipe, 7: laser unit, 8: optical window, 9: cooling unit, 10: exhaust port, 11: measurement window, 12: radiation thermometer, 13: yttria coating, 14: test substrate, 15: anodic oxide film, 16: vacancy.

The invention claimed is:

1. A method for producing a corrosion-resistant member comprising a substrate comprising aluminum or an aluminum alloy and an yttria coating formed on a surface of the substrate, the method comprising:

reducing a reflectance of an irradiation target surface of the substrate to be irradiated with laser light; and forming the yttria coating on the surface of the substrate by irradiating the substrate with laser light while the substrate is blown with a raw material gas containing yttrium, and controlling a temperature of the substrate to be 300° C. to 600° C. during deposition of the yttria coating, wherein the laser light is in a form of a pulse wave, and reducing the reflectance is performed prior to forming the yttria coating.

2. The method for producing a corrosion-resistant member according to claim 1, wherein, during deposition of the yttria coating, the yttria coating is formed on the substrate placed on a sample stage in a chamber with the sample stage being under temperature control to have a temperature of 0° C. to 200° C.

3. The method for producing a corrosion-resistant member according to claim 2, wherein the sample stage is cooled with a liquid refrigerant for the temperature control.

4. The method for producing a corrosion-resistant member according to claim 1, wherein the yttria coating is deposited at a deposition rate of 10 to 1000 μm/Hr during deposition of the yttria coating.

5. The method for producing a corrosion-resistant member according to claim 1, wherein the laser light has an average output of 5 to 2000 W during deposition of the yttria coating.

6. The method for producing a corrosion-resistant member according to claim 1, wherein the laser light has a pulse width of 1 to 1000 ns during deposition of the yttria coating.

7. The method for producing a corrosion-resistant member according to claim 1, wherein the laser light has a peak power of 100 W to 30 KW during deposition of the yttria coating.

8. The method for producing a corrosion-resistant member according to claim 1, wherein the laser light has a pulse energy of 0.1 to 30 mJ during deposition of the yttria coating.

9. The method for producing a corrosion-resistant member according to claim 1, wherein the laser light has an average energy density of 10 to 1000 $W/mm^2$ in laser irradiation during deposition of the yttria coating.

10. The method for producing a corrosion-resistant member according to claim 1, wherein the reflectance at a wavelength of the laser light is set to 50% or less after the reducing of the reflectance.

* * * * *